(12) United States Patent
Morel et al.

(10) Patent No.: US 8,138,087 B2
(45) Date of Patent: Mar. 20, 2012

(54) METHOD OF MANUFACTURING AN INTEGRATED CIRCUIT

(75) Inventors: Stephane Morel, Frenouville (FR); Arnoldus Den Dekker, Beuningen (NL); Elisabeth C. Rodenburg, Eindhoven (NL); Eric C. E. Van Grunsven, Someren (NL)

(73) Assignee: NXP B.V., Eindhoven (NL)

( * ) Notice: Subject to any disclaimer, the term of this patent is extended or adjusted under 35 U.S.C. 154(b) by 333 days.

(21) Appl. No.: 12/441,769

(22) PCT Filed: Sep. 17, 2007

(86) PCT No.: PCT/IB2007/053739
§ 371 (c)(1),
(2), (4) Date: Mar. 18, 2009

(87) PCT Pub. No.: WO2008/035270
PCT Pub. Date: Mar. 27, 2008

(65) Prior Publication Data
US 2009/0267232 A1    Oct. 29, 2009

(30) Foreign Application Priority Data

Sep. 18, 2006 (EP) .................................... 06019491

(51) Int. Cl.
*H01L 21/44* (2006.01)
*H01L 21/00* (2006.01)

(52) U.S. Cl. .................... 438/667; 438/160; 438/598
(58) Field of Classification Search .................. 438/160, 438/598, 667
See application file for complete search history.

(56) References Cited

U.S. PATENT DOCUMENTS

| | | | |
|---|---|---|---|
| 5,476,819 A * | 12/1995 | Warren | 438/456 |
| 6,235,554 B1 * | 5/2001 | Akram et al. | 438/109 |
| 2002/0180015 A1 | 12/2002 | Yamaguchi et al. | |
| 2005/0079712 A1 * | 4/2005 | Tong et al. | 438/689 |
| 2006/0055050 A1 | 3/2006 | Numata et al. | |
| 2006/0189094 A1 * | 8/2006 | Joodaki | 438/455 |

FOREIGN PATENT DOCUMENTS

| | | |
|---|---|---|
| WO | 0161847 | 8/2001 |
| WO | 0213258 A | 2/2002 |
| WO | 03085729 A | 10/2003 |

OTHER PUBLICATIONS

Kondo, I., et al; "Effects of Different Pretreatments on the Surface Structure of Silicon and the Adhsion of Metal Films"; Journal of Vacuum Science and Technology; Part A, AVS/AIP; Melville, NY, US; vol. 10, No. 5; Sep. 1, 1992; p. 3166-3170; XP000305790; ISSN: 0734-2101.

* cited by examiner

*Primary Examiner* — James Mitchell

(57) ABSTRACT

An integrated circuit is provided that comprises a substrate of silicon and an interconnect in a through-hole extending from the first to the second side of the substrate. The interconnect is coupled to a metallization layer on the first side of the substrate and is provided on an amorphous silicon layer that is present at a side wall of the through-hole, and particularly at an edge thereof adjacent to the first side of the substrate. The interconnect comprises a metal stack of nickel and silver. A preferred way of forming the amorphous silicon layer is a sputter etching technique.

14 Claims, 10 Drawing Sheets

METHOD OF MANUFACTURING AN INTEGRATED CIRCUIT

FIELD OF THE INVENTION

The invention relates to a method of manufacturing an integrated circuit comprising a substrate of semiconductor material with a first and an opposite second side, comprising the steps of (1) providing a metallization layer on the first side of the substrate; (2) forming a through-hole extending from the first to the second side of the substrate, and (3) providing a sidewall of the through-hole with an electrically conductive layer to form an interconnect coupled to the metallization layer on the first side of the substrate.

The invention further relates to an integrated circuit thus formed. Silicon substrates are increasingly used as carriers for integrated circuits. In order to provide an adequate grounding, through-holes are formed and at least partially filled with conductive material to form interconnects. While this is particularly needed to increase performance at RF frequencies, the interconnects allow efficient exposure of contacts.

BACKGROUND OF THE INVENTION

The requirements to forming such interconnect in a through-hole is the compatibility with further processing to manufacture the integrated circuit. This includes both front-end processing, such as needed for the definition of electrical elements and the forming of metallization layers, and back-end processing, which are also known as assembly processes. Moreover, the interconnect should meet product reliability requirements. Suitably, the through-hole is formed from the second side with one or more etching techniques. Therewith, the metallization layer is exposed. Then, electrically conductive material is provided so as to form the via. Several techniques such as sputtering, chemical vapour deposition and electroplating may be used alternatively and/or in combination. It has been found in experiments that the adhesion of the electrically conductive layer to the substrate does not always meets the reliability requirements. Adhesion is known to be an issue in industrialisation of new semiconductor processes. Several factors may cause insufficient adhesion, and combination effects are herein not to be excluded. Good adhesion is in other words an engineering challenge.

It is therefore an object of the invention to provide a method which allows good adhesion.

This object is achieved by forming an amorphous silicon layer prior to deposition of the electrically conductive layer. The conductive layer is chosen so as to prevent damage to the amorphous silicon layer. The amorphous silicon layer is found suitable for provision of good adhesion, if it is not subsequently damaged. Such damage may occur if it reacts. Now, a conventional adhesion layer such as sputtered titanium, has a very high reactivity towards amorphous silicon. This may cause so-called Kirkendall voiding, which deteriorates the adhesion.

Suitably, the amorphous silicon layer has a thickness of less than 10 um, preferably even less than 3 um. This decreases the size of any voids formed nevertheless. It is understood that the term 'amorphous silicon layer' does not exclude the presence of any polycrystalline regions within the amorphous silicon layer.

Most favourably, the conductive layer comprises a protection layer for the amorphous silicon. Suitably, this is a nickel layer. Particularly in combination with the nickel layer, use of silver has turned out very beneficial The amorphous silicon layer is preferably formed by sputter etching technique. The step of sputter etching may be combined with the removal of any native oxide on the metallization layer.

BRIEF DESCRIPTION OF THE DRAWINGS

These and other aspects of the invention will be further elucidated with respect to the Figures that are not drawn to scale and are purely diagrammatical, and in which the same reference numerals in different Figures refer to identical features, in which.

DETAILED DESCRIPTION OF EMBODIMENTS

Figure 1:
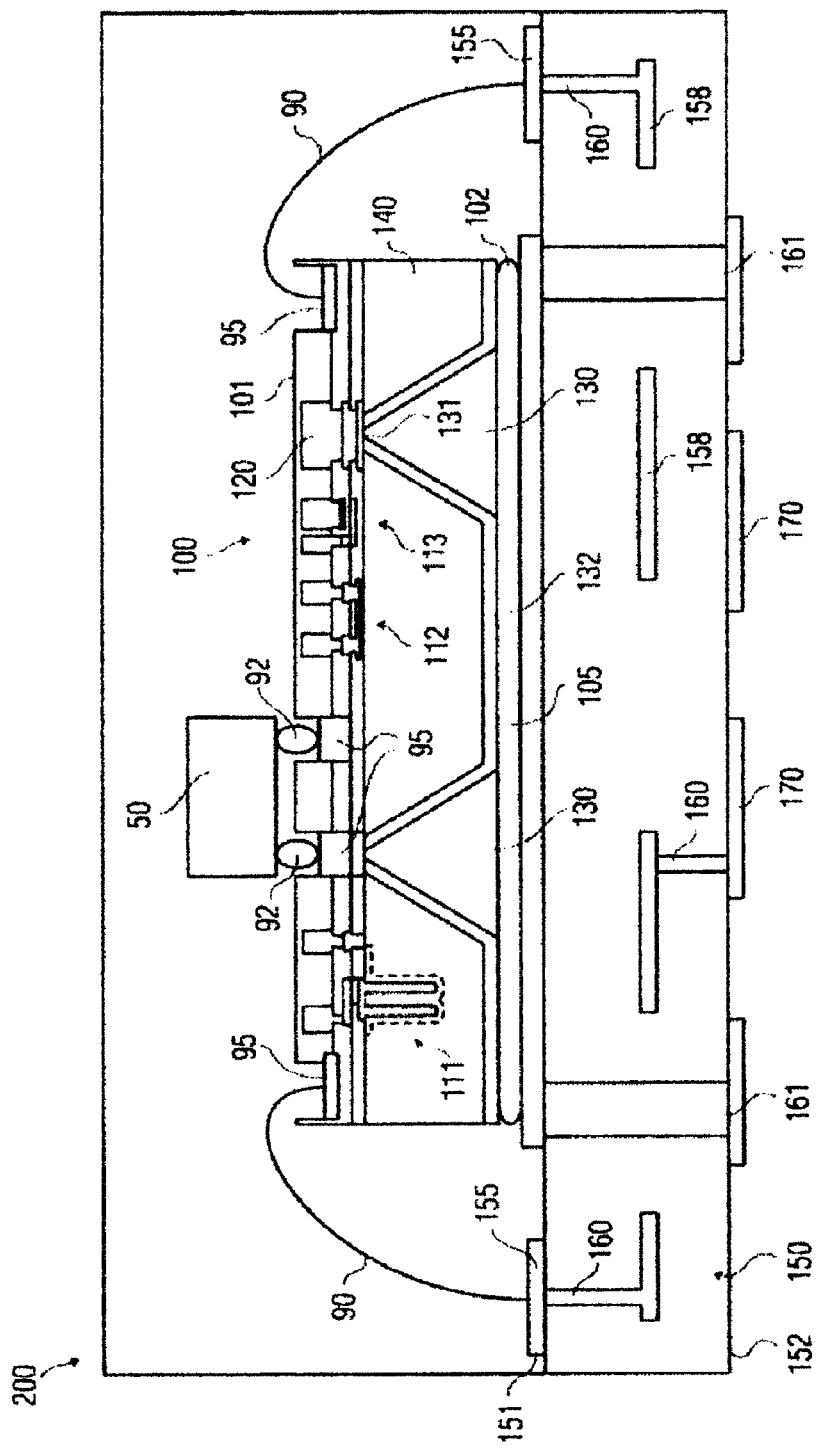
FIG. 1 shows in cross-sectional view the assembly of the invention.

FIG. 1 shows in a cross-sectional view a first embodiment of the assembly 200 with the passive IC 100 of the invention. This passive IC 100 comprises a first side 101 and a second side 102 and is provided with an interconnection substrate 140 of semiconductor material. The substrate 140 comprises vertical interconnects 130 extending from the first side 101 to the second side 102. The passive IC 100 is attached with its second side 102 to a first side 151 of a carrier substrate 150 with an adhesive 105. Bond wires 90 extend from bond pads 95 on the passive IC 100 to corresponding bond pads 155 on the carrier substrate 150. Electrical vertical interconnects 160 extend through the carrier substrate 150 to terminals 170 on a second side 152 of the carrier substrate 150, facing away from the first side 151. Thermal vertical interconnects 161 extend to at least one thermal terminal 171 at the second side. The carrier substrate 150 further contains one or more inductors 158, which are in at least most cases coupled to bond pads 155 on the first side 151. Passive elements 111-113 have been defined on the first side 101 of the passive IC 100, in addition to interconnects 120 and bond pads 95. Some of those bond pads are provided with bond wires 90 to the carrier substrate 150, while others are provided with solder balls 92 to electrical devices 50 assembled on top of the passive IC 100. It is alternatively possible to provide another connection between any electric device 50 and the passive IC 100, for instance with bond wires, TAB-foil or the like. Examples of electrical devices 50 include a power amplifier, a power control integrated circuit, switches, band pass filters, such as bulk acoustic wave filters, and impedance matching networks, particularly with variable capacitors in the form of MEMS-elements or varactors.

The substrate 140 of a semiconductor material has a resistivity which has been tuned so as to allow definition of high quality inductors on the substrate 140. Particularly, the resistivity has been increased in at least part of the substrate 140, for instance by implantation of dopants such as Ar, Ne, Nitrogen or through irradiation with for instance e-beam. A suitable resistivity is a resistivity of more than 1 kohm/square. The construction of the passive IC 100 will be discussed in more detail with reference to its manufacture, see FIG. 2-4.

Figure 2:
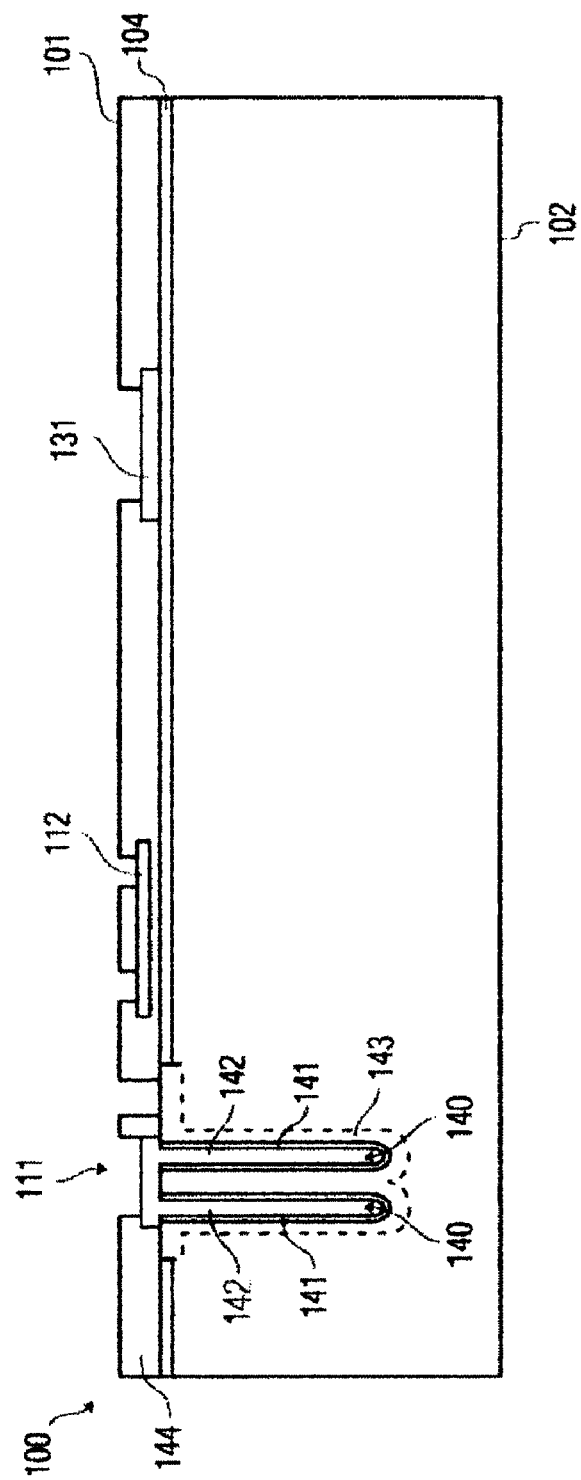
FIGS. 2-4 show in cross-sectional view several stages in the manufacture of the passive IC used therein.
Figure 3:
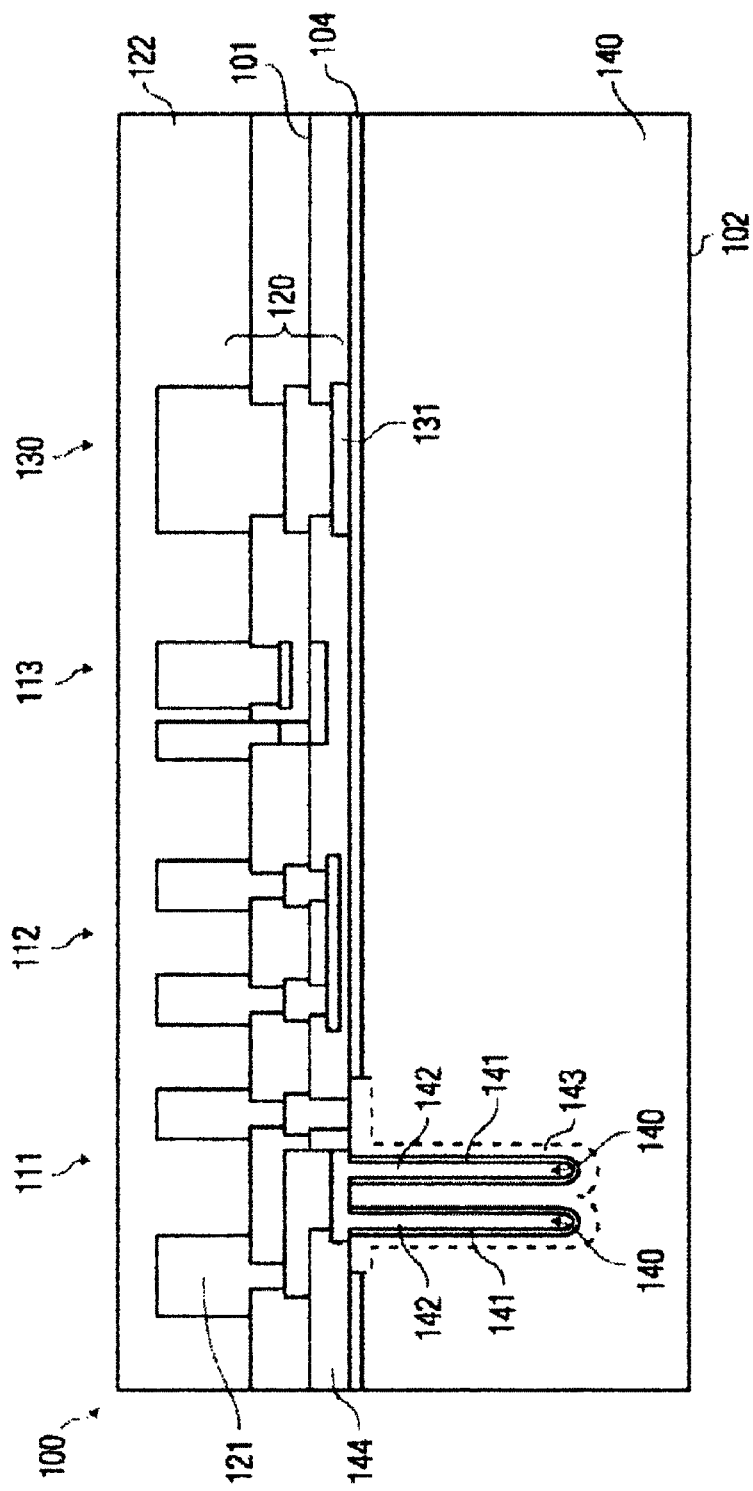
Figure 4:
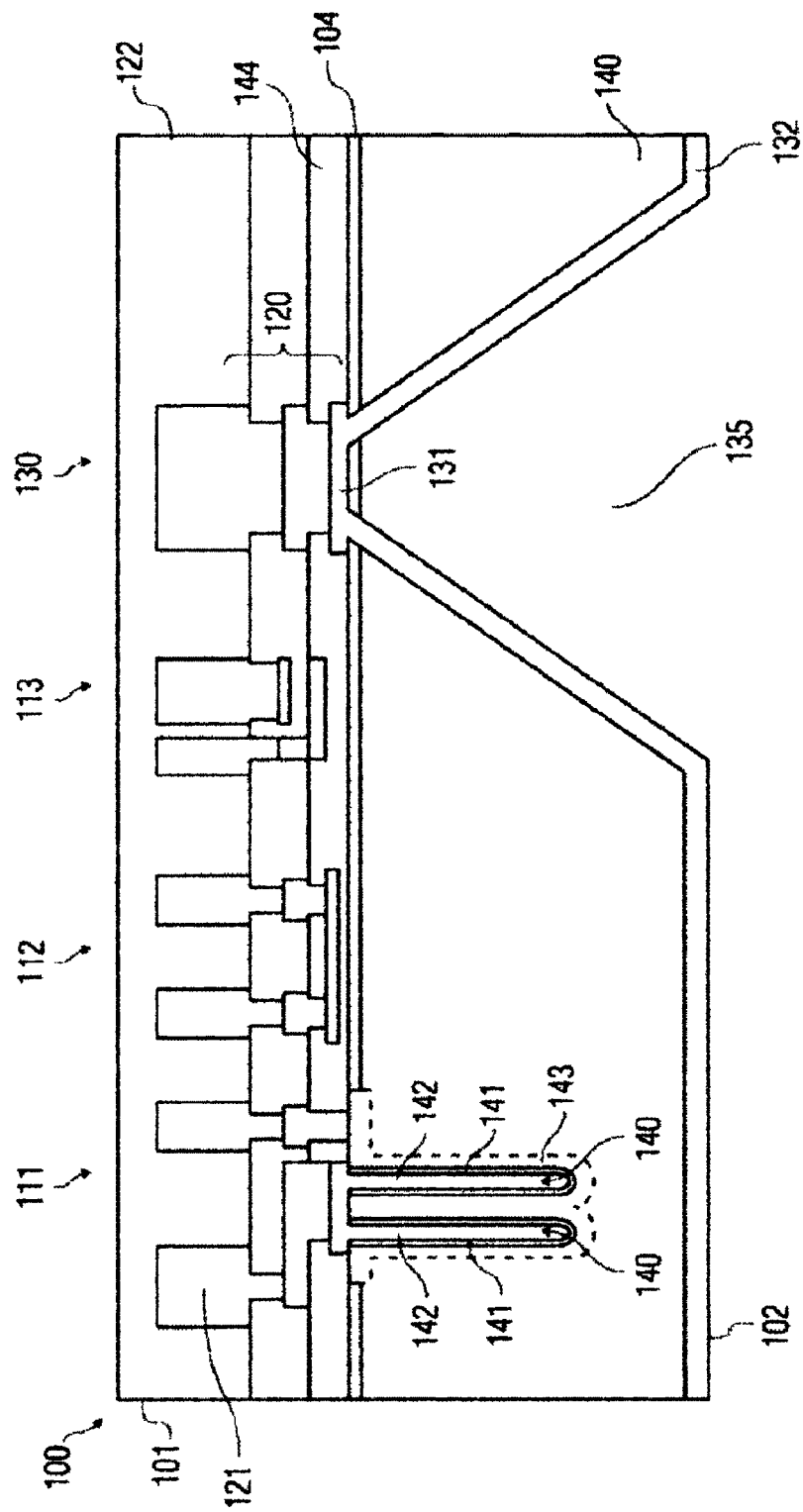

FIGS. 2-4 show the manufacture of the passive IC 100 according to a first embodiment. An insulating layer 104 is defined on the first side 101. Trenches have been etched in the substrate 140 and filled with dielectric material 141 and electrically conductive material 142 to define a capacitor 111. This capacitor 111 has due to its shape a relatively high capacitance density, particularly of 25-100 nF/mm2 or even more. The shape of the trench is open to a design that may be optimised. It could alternatively comprise pillar structures within cavities in the substrate, as has been described in the non-prepublished application PH005852 (EP 06300422.0). The dielectric material suitably comprises a nitride, and most suitably an oxide-nitrideoxide stack. A surface 143 of the trench is doped with electrically conductive particles, in a manner known to the skilled person, in order to function as a capacitor electrode. The conductive material 142 is suitably polysilicon that is doped in known manner. The conductive material 142 is additionally provided at selected areas outside the trench, which is advantageous but not necessary. In this example, some area is used as a resistor 112, while another area is used as a barrier layer 131 that will be part of the vertical interconnect 130 through the interconnection substrate 140. A dielectric material 144 is provided according to a desired pattern, in a manner known to the skilled person, to define contacts to the passive components 111, 112.

FIG. 3 shows the passive IC 100 in a second stage after provision of a metallization structure 120 including electrically conductive and electrically insulating patterns. The metallization structure 120 comprises an additional capacitor 113. This capacitor has a lower capacitance density than the trench capacitor 111, which is often needed in RF applications, while it is defined more precisely, with a better breakdown voltage and with low-ohmic electrodes. The resistor 111 is provided with contacts IIIA in a separate layer. The metallization structure 120 has been expanded with a further metal layer 121. This metal layer 121 has a large thickness, i.e. suitably over 1 microns, in order to define inductors that function properly at RF frequencies. Thereto, the thickness must be larger than twice the penetration depth of currents at the frequencies in use. This penetration depth depends on the material of the metal layer 121, which may be a metal such as Al, Cu, Au, an alloy such as Al.Cu, Al.Si, Al.Mg or even doped polysilicon. The metal layer 121 is shown to be covered with a further dielectric layer 122. This further dielectric layer 122 is to be opened or to be removed in order to give access to any bond pads—not shown—in the metal layer 121.

FIG. 4 shows a further stage in the manufacture of the passive IC 100. Herein, vertical interconnects 130 are fabricated by wet-chemical etching of through holes 135 from the second side 102 and subsequent provision of electrically conductive material 132. In the manufacture of the through-holes 135, the etching is brought to an end by an etch stop layer on the front side of the semiconductor substrate 140. This may be a conventional insulating layer 104, such as a nitride or an oxide, but could alternatively be a metal layer. The electrically conductive material 132 is deposited both on the walls of the etched through-hole 135 and on any exposed metal of the metallization structure 120. Preferably, the through-holes 135 are not filled completely. This prevents that cracks develop in the semiconductor substrate 140 due to differential thermal expansion of the substrate 140 and the metal in the through-hole 135, particularly during thermal cycling or further assembly steps. This electrically conductive material 132 advantageously comprises a barrier layer, which prevents the formation of undesired alloys between the substrate material (e.g. Si), the exposed metallization structure on top of the vertical interconnect (e.g. Al or Al alloys). It was found in experiments that use of Ti as a barrier layer does not give appropriate results due to reactions between the Al and Si and/or the Ti that are induced by the Ti. Use is made here of a stack of Ni and a further conductive layer, such as silver, aluminum, aluminum alloys, copper, palladium, titanium nitride or gold. Surprisingly, it has been found that the resulting vertical interconnect has a low impedance and does not suffer from magnetic currents within the Ni layer of the interconnect 130.

In Relation to the Heat Spreader Function of the Substrate.

According to a first aspect of the invention, the vertical interconnects 130 through the substrate 140 provide a grounding path for a power amplifier assembled on the front side 101, while the substrate 140 operates as a thermal path. Particularly, it has been found that there is an optimum thickness for the interconnection substrate, at which both a proper grounding and an acceptable thermal dissipation is obtained. This optimum thickness is in the range of 100 to 300 micrometer for the case of a silicon substrate with wet-etched through-holes. If the substrate 140 has a smaller thickness than 100 micrometer, the quality factor of any of the inductors on top of the semiconductor substrate 140 decreases below an appropriate level. Additionally, the overall thermal resistance has been found to increase. If the substrate has a larger thickness than 300 micrometer, then the parasitic inductance of the vertical interconnect 130 increases above an acceptable level and the RF grounding performance will degrade. In the case of dry-etched through-holes, the thickness may be as large as 400 micrometers. It is observed that this optimum thickness is particularly relevant if the substrate has a lateral width that is larger than the effective distribution of heat within the substrate. This is certainly the case with the platform device of the invention. Moreover, it was found that the use of the passive IC 100 according to this first aspect of the invention leads to a lower junction temperature of the RF power amplifier 50 device. Such a lower junction temperature additionally leads to an improved operation of the power amplifier device. The linearity of the power amplifier has been found very sensitive for both the operating temperature and a proper electrical grounding. By using the present construction, both are realized. In fact, in the case of an RF power amplifier on a passive IC, the thermal resistance Rth of the assembly is lower than if the amplifier were assembled on the laminate carrier substrate 150 directly. Due to the presence of the passive IC 100 with its semiconductor substrate 140, the heat flows much rapidly 'outside'. Therefore, the junction temperature Tj is lower because Tj is a function of the Rth. This improved heat spreading is due to the fact that a power amplifier is not a component that is continuously operating at maximum power. Its operation can be considered as a series of power bursts, which particularly occur when making connection with a base station and when amplifying signals.

Usually, this leads to a large variation in temperature, caused by heating up and cooling down of the amplifier. Now by using the semiconductor substrate as a heat spreader, the temperature is, kept relatively constant. The operation as heat spreader is additionally profitable, as generally, the 'steady state' in which the semiconductor substrate 140 of the passive IC 100 is completely heated up, hardly occurs. For this reason, transfer of heat from the substrate 140 of the passive IC 100 to the laminate carrier substrate 150 is less important). This, evidently, depends also on the communication standard in use and modulation scheme (e.g. GSM, W-CDMA, Bluetooth, etc).

The improved heat spreading does not only contribute to the efficiency of the amplifier, but also prevents that cracks are initiated in the semiconductor substrate due to difference in coefficient of thermal expansion between the substrate and the electrically conducting connections (vias) therein. An additional effect relates to the expansion and contraction of the laminate. The laminate has a Coefficient of Thermal Expansion (CTE) that is different from a semiconductor substrate, which is a known concern in packaging, for instance in Fine pitch Ball Grid Array Packages. It is known that the cooling phase during thermal cycling is most problematic for the stability of the package, in view of the different contraction of laminate as compared to chip. Now, with the invention, there is less cooling, and also less rapid cooling, and the local maximum temperature decreases at the interface of laminate with the semiconductor material. In short, this contributes to reliability in thermal cycling. The impedance of the vertical interconnect evidently depends on the actual length of the connection. In one embodiment, the interconnect is made by wetchemical etching from the rear side of the semiconductor substrate and by subsequent metallization of the resulting surface. This wet-etching leads to a cone-shaped throughhole. Any variation in the thickness of the substrate will lead to a deviation of the cross-sectional area of the throughhole—and therewith the interconnect—at the front side of the substrate. It has turned out that particularly the size of this cross sectional area is relevant for the impedance of the vertical interconnect.

When using a substrate thickness in the selected range, and particularly in the preferred range, this deviation of the impedance of the vertical interconnect has negligible impact on the proper functioning of the device.

Suitably, the vertical interconnects do not provide merely a single grounding path to the amplifier, but a plurality of grounding paths. These grounding paths are electrically coupled to different stages in the power amplifier, such as the input and the output and any intermediate stage. The use of a multiple grounding for a RF power amplifier is needed so as to ensure sufficient stability of the amplifier. In RF circuits, an interconnect also has a relevant impedance. Without multiple groundings, a deviation of the ground impedance in one stage (for instance due to the power amplifier operation) would define the ground level in another stage. This introduces uncontrollable artifacts that may disturb an efficient operation of the amplifier. Moreover, such coupled grounding might function as an additional feedback, and the creation of a cycle within the amplifier, in which an amplified current would be fed back to the input of the amplifier. This is undesired, as it may cause breakdown.

Now, according to the invention, it has been found that the impedance of a path from an front side's end of a vertical interconnect to that of a neighboring vertical interconnect is sufficient to make the grounding independent from each other from an RF perspective. This is also the case, when the metallization of the vertical interconnects extends on substantially the complete second side 102 of the vertical interconnection substrate 140, (e.g. the metallization on the second side 102 is unpatterned). This absence of patterning is moreover advantageous, in that the metallization tends to improve the heat transfer from the semiconductor substrate to the adhesive between the passive IC 100 and the carrier substrate 150.

In Relation to the Passive Components

The passive IC 100 comprises different types of inductors and capacitors, and additionally resistors. Each type inductor and capacitor has its own properties, which may be exploited for different functional elements in the RF design of the passive IC:

trench capacitors have a high capacitance density (particularly about 10 nF/mm2, suitably above 20 nF/mm2) with a relative breakdown voltage. These are useful for decoupling applications a planar capacitor, with a top electrode in an intermediate metallization layer. This contributes to a precise definition of the capacitor. Its capacitance density is suitably between 100 and 200 pF Imm2. It is constructed as patented in WO2001061847. This capacitor is highly suitable for RF applications.

an inductor in the bottom metal layer; this inductor has the advantage of a relatively high resolution patterning, enabling the provision of many turns. However, the thickness of the metal layer is relatively limited (for instance in the order of 0.2-0.6 microns), so that the quality factor is limited. This inductor is for instance suitable for RF choke applications an inductor in the top metal layer; this inductor has the advantage of a relatively high quality factor, as the thickness is chosen to be more than twice the penetration depth of currents at relevant high frequencies between 0.8 and 2.5 GHz. This inductor has furthermore the advantage that it may be defined as a portion of an interconnect line. Suitably, such inductor is provided in a U-shape. It is defined in the same layer as the bond pads an inductor in the intermediate metal layer (thickness about 1 micrometer). Thanks to this plurality of available types of passive elements and the availability of multiple grounding with vertical interconnects extending through the substrate, the passive IC enables the replacement of all discrete elements. This additionally enables a functionality increase without a size increase of the power amplifier module.

The passive IC is particularly a power amplifier device, since a power amplifier uses high powers (for instance more than 3 W), which is much more than many other devices, such as transceivers, displays and the like. Moreover, the impedance matching that is needed for the power amplifier and at the antenna requires a plurality of passive components of substantial dimensions. Furthermore, the passive IC allows the provision of amplifiers and impedance matching for more than one frequency band.

In Relation to the Power Amplifier the power amplifier is particularly designed to be suitable for RF applications, such as frequency bands above 900 MHz up to 3 GHz. This frequency spectrum includes GSM, CDMA, W-LAN, WiMAX, 802.11 and other communication standards. Non-linearities of the signal amplification lead here very rapidly to the provision of noise or a substantial decrease in efficiency.

the power amplifier can be placed in a flip-chip arrangement on the interconnection substrate. This enables a linear connection form ground to Power Amplifier (PA), with minimal losses. The power amplifier is for instance embodied in a SiGe technology such as for instance Qubic4 as made by Philips Semiconductors. The power supply and ground routing on the power amplifier device can be advantageously lay-outed in order to improve the power and ground performance by a good distribution (for instance, a star connection). The improvement is then on the lay-out side the other improvement is in the via holes themselves: they can be designed so that they improve both the ground inductance and the thermal transfer (by using copper for instance in the via). One may provide several amplifiers on the passive IC. Such a construction is suitably for multi-band power amplifier modules.

Use of solder balls with a smaller pitch between the power amplifier and the interconnection substrate. This is enabled as there is no difference between the CTEs of both components. The result is miniaturization.

In Relation to the Passive IC

In one embodiment, the passive IC defines a circuit element leading from an input to the power amplifier up to an output to an antenna, with the exception of certain specific functions therein. The power amplifier usually includes a plurality of stages, in this example three stages. Interstage impedance matching is carried out between the stages of the power amplifier. After the final amplification stage, the signal passes an output match, an antenna switch, a low-pass filter and an impedance matching network. The antenna switch enables switching between the transmit and the receive bands. A further interconnect is present between the antenna switch and an output to a low noise amplifier for amplification of the received signal. The low pass filter and the impedance matching network are in this example integrated into a single functional block. If the passive IC is suitable for the processing of signals in more than one frequency band, a band switch is provided additionally. Particularly, such band switch is present between the power amplifiers and the antenna switch. The interstage impedance matching comprises an LC-network, wherein the capacitors are connected in the signal line, while the inductor is coupled between the signal line and ground. In a suitable example, such LC-network comprises three inductors and two capacitors.

In the present assembly, capacitors and inductors may be defined in the power amplifier device, on the passive IC and in the carrier substrate. In a suitable embodiment, at least one of the inductors of the interstage matching is provided on the passive IC. This appears advantageous so as to minimize the size of the power amplifier device. In the embodiment that the power amplifier is assembled to the passive IC in a flip-chip orientation, e.g. with solder bumps, the inductor is suitably defined in an area facing the power amplifier device. This is allowed, as the inductor operates as an RF choke, for which the quality factor is not highly relevant. In order to minimize noise, the power amplifier device is designed so as that an area overlapping with said inductors is kept free of sensitive components, The capacitors of the interstage matching are however provided in the power amplifier device. As the power amplifier device is defined with a higher resolution than the passive IC, the capacitor in the amplifier device may be provided with a relatively high capacitance density. Moreover, integration of the capacitor in the power amplifier reduces the length of the interconnects to the capacitor, and therewith any parasitic inductance.

The situation is different for the output matching. The impedance in the power amplifier is rather low, particularly only a couple of ohms, while the standard impedance level in RF applications is defined as 50 Q. The output match here enables the transformation. Due to the size requirements, the transformation is preferably carried out in the carrier substrate. This additionally allows the use of inductors with coupled windings on top of each other. Thereto, the interconnect on the passive IC from the output of the amplifier to the output match is defined as a very low-ohmic interconnect. Thereto, the connection of the amplifier to the passive IC is made with a plurality of solder bumps. The interconnect is given sufficient width, while a grounded metal face on the rear side of the passive IC provides the interconnect with a strip line character. The connection to the carrier substrate is enabled with bond wires.

For the low pass filter, one requires to have low losses and to prevent any parasitic coupling through the substrate. Additionally, the specified tolerances are low. It has turned out, that the parasitic coupling occurs primarily in a direction normal to the substrate. This coupling is caused by a magnetic field, while an electrostatic field is at least substantially absent. The sources for such parasitic coupling are any bond wires between carrier substrate and passive IC, as well as vertical interconnects through the substrate. In order to improve the low pass filter, the inductor is defined in the passive IC, while any bond wires are absent between the antenna switch and the output to the antenna. While this example shows the provision of inductors in the carrier substrate 150, the inductors may be defined in a separate device so as to reduce the complexity of the carrier substrate 150. In that case, a leadframe could be used instead of a laminate as the carrier substrate 150. The separate device is for instance a metal layer that is integrated in an encapsulating mould, as is known per se from WO-A 2003/85729.

Suitably, the passive IC enables the processing of signals from at least two separate frequency bands. In this case, the power amplifier device and a power control device may be designed so as to operate for both frequencies. Particularly, the power amplifier device then comprises a first section for the first band and a second section for the second band, which sections are independent and free of any mutual connection. Interconnects for power control signals are suitably defined in an area on the passive IC between both sections. An isolation area is defined in the power amplifier device between the sections for the different frequency bands. The power control interconnects on the passive IC may then extend below this isolation area.

In Relation to the ESD Protection of the Passives.

In order to protect the passive IC against electrostatic discharge pulses that may occur during assembly, it comprises a specific protection. Particularly small capacitors in the passive IC are highly sensitive to ESD pulses. Such capacitors may be implemented as planar capacitors, but alternatively as trench capacitors in the substrate. Integration of diodes or other active elements in the passive IC is difficult. Crosstalk between individual active elements readily occurs due to the high resistivity of the substrate, unless specific shielding of the elements is implemented.

According to this aspect of the invention, the capacitor is ESD protected through a resistor between the capacitor output and a ground connection within the passive IC, which resistor has a resistance value that is sufficiently high so as to prevent any substantial influence on the RF grounding. Due to the choice of the resistor, there is no DC voltage over the resistor during use of the passive IC. If needed, an additional capacitor can be connected in series with the resistance. The term 'capacitor output' is used herein to define the output that is connected to ground after finalization of the assembly.

Figure 5:
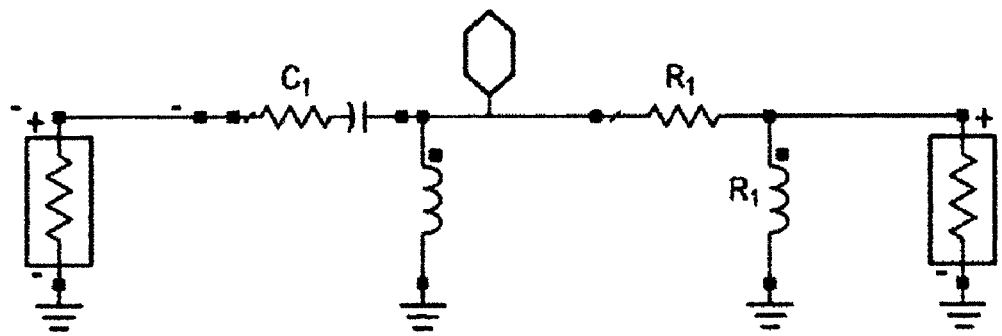
FIG. 5 shows an equivalent circuit of decoupling plus ESD protection resistance after wirebonding.

FIG. 5 shows an equivalent circuit of the passive IC with the ESD protection according to the invention, in the situation after assembly. The capacitor C1 is a capacitor with a relatively low breakdown voltage that is sensible for ESD pulses that occur during assembly—which are generally lower than those occur during use of the device. The capacitor C1 is in this case a planar metal-insulator-metal capacitor with a capacity of 30 pF. It is coupled on its input to an internal circuit, which is in itself provided with a ground connection with a standard impedance of 50 ohm. The capacitor output is coupled to an external ground through a bond wire. This bond wire has a typical resistance of 0.1 ohm, and an inductance of 1.0 nH, as calculated at a frequency of 20 Hz. The capacitor output is herein further coupled to a bond pad 95, to which a further component may be assembled. In the invention, an ESD protection is provided with a suitable resistor, that provides a connection to an internal ground over a parasitic inductance of merely 0.2 nH. This is suitably enabled with a vertical interconnect through the substrate. It is also coupled from further internal ground (IG), with an impedance of 50 Ohm.

Figure 6:
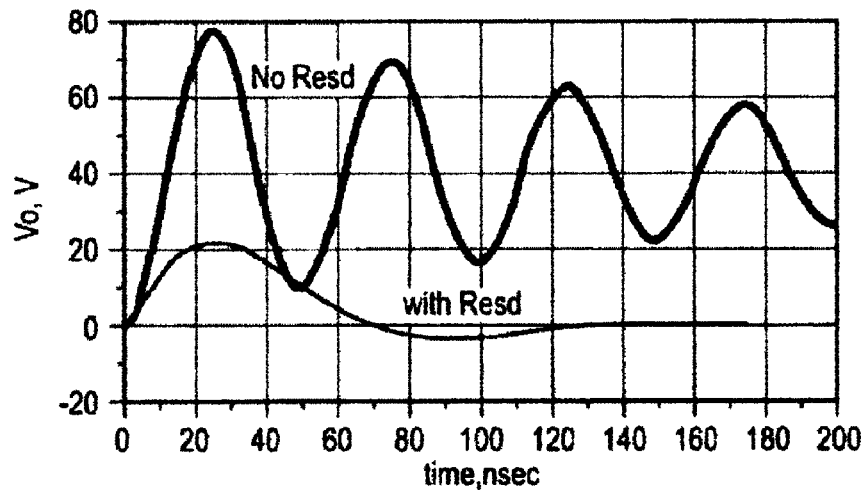
FIGS. 6 and 7 show the reduction of peak voltage as a function of time elapsed after an ESD event for a circuit with and without the ESD-resistor, as measured according to two different ESD-models.
Figure 7:
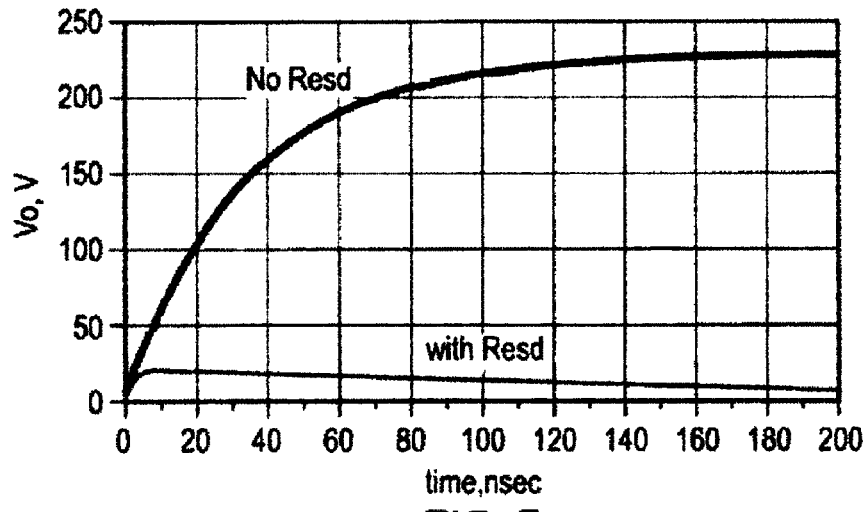

FIGS. 6 and 7 show the resulting reduction of the ESD peak voltage according to two models—a 50 V peak in the Machine Model (FIG. 6), and a 300 V peak in the Human Body Model (FIG. 7). The reduction of the ESD peak is substantial. The reduction of peak voltage is fourfold for a 50V ESD pulse—from 80 to 20 V—, as given in accordance with the Machine Model. The reduction of peak voltage is even much more for a 300 V ESD pulse, as given in accordance with the Human Body Model. Without resistor, peak voltages above 200 V were found. The peak voltage remained in a time frame of far more than 200 ns. With the resistor, the peak voltage was less than 20 V, and dissipation started already after 10 ns. It has been found that this coupling between an internal ground and an external ground has marginal influence on the RF behavior of the passive IC. The ground impedance is slightly higher at 900 MHz (1.5 vs 1.1. ohm impedance value). The coupling between internal and external ground increases with the frequency, and is at 1 GHz about −50 dB and at 3.0 GHz less than −30 dB. These are acceptable levels of coupling.

Suitably, the resistance value of the ESD protection is at least ten times as large as the impedance of the connection from the bond pad to external ground. In the case of a bond wire, such connection impedance is for instance 6 Ohm/square at a frequency of about 2 GHz. The resistance value is then suitably larger than 60 Ohm/square for instance up to 200 Ohm/square.

The ESD resistor should be designed to allow the flow of a peak current following an ESD pulse through it. In case that the ESD resistor is aimed at the prevention of damage of an ESD event during assembly or prior to assembly, the voltages of an ESD pulse and the following current are relatively low, and a resistor in doped polysilicon is adequate, while a resistor of TiWN is one of the available alternatives. If one desires to improve an ESD-protection level from 2 kV to 4 kV, the resistor should be designed for a peak current of 3 A. This ESD protection is particularly suitable for passive ICs as discussed in the present application. In such passive ICs for RF power applications, the input stage cannot be decoupled and grounded via the normal ground, as this would introduce too much coupling between input and output, which leads to instabilities. It is however not limited thereto, and may be used with benefits for any device comprising ESD-sensitive devices, such as in particular trench capacitors.

Figure 8:
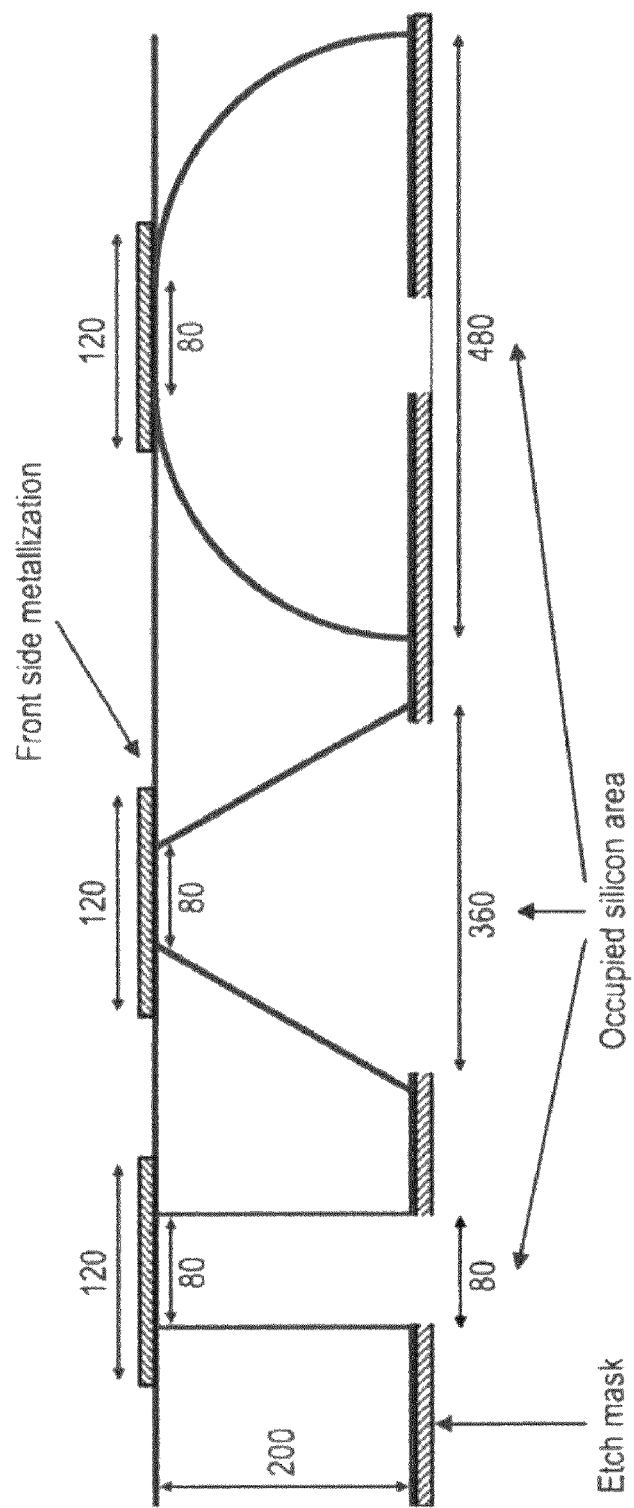
FIG. 8 shows methods for making vias and the resulting shape.
Figure 9A:
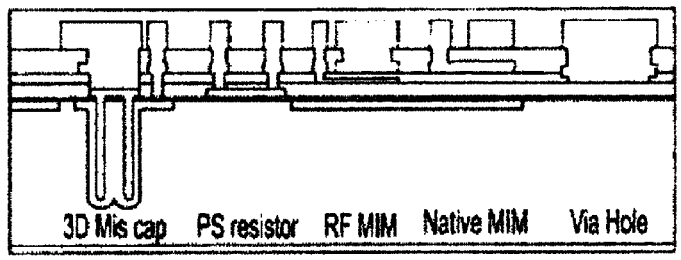
FIG. 9 provides a sequence of steps of the method of the invention.
Figure 9B:
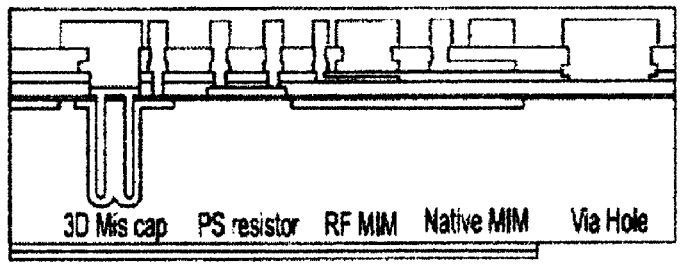
Figure 9C:
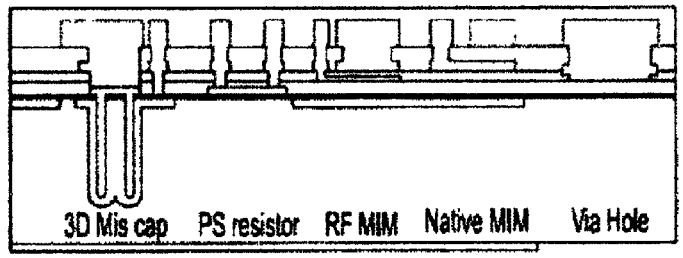
Figure 9D:
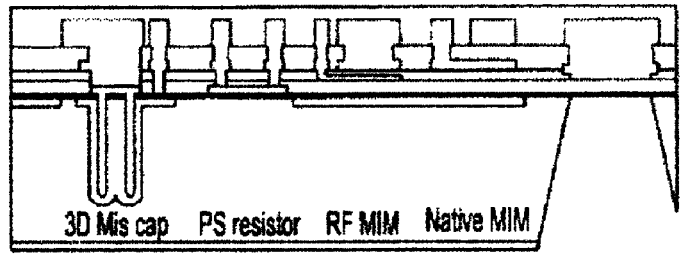
Figure 9E:
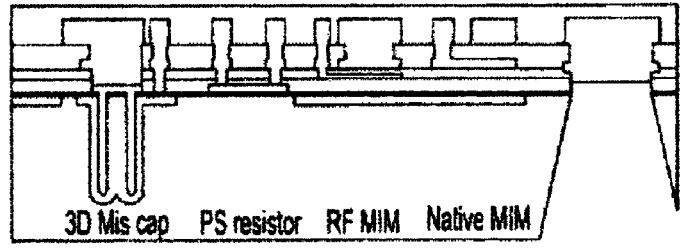
Figure 9F:
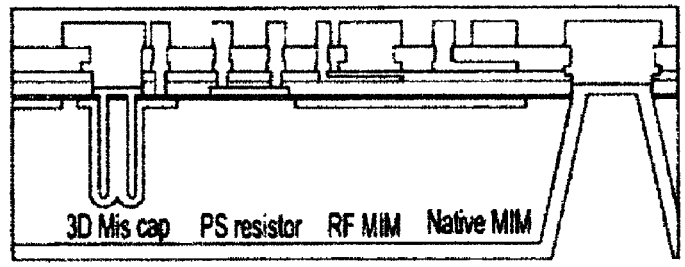
Figure 10:
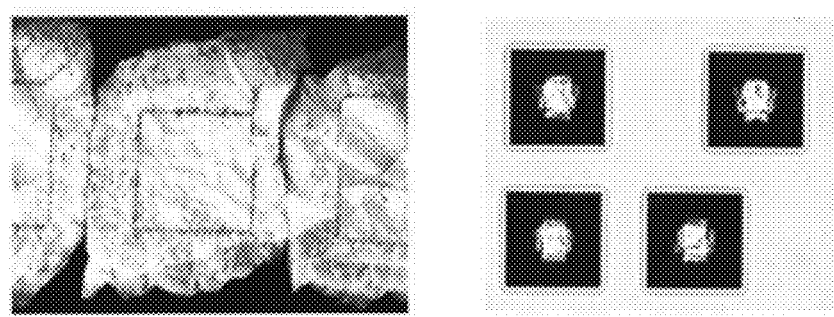
FIG. 10 shows a picture of different etching process; at the left hand an example of uncontrolled KOH etching due to lattice damage; at the right hand an example of controlled KOH etching is shown.

Now, the formation of the amorphous silicon layer will be discussed in more detail This will be done with reference to an embodiment, in which the amorphous silicon layer is formed by sputter etching, simultaneously with exposing the metallization layer. This is however not essential. To obtain a through wafer interconnect several via forming techniques are possible, each resulting in a specific via shape (see FIG. 8).

A first via forming method is dry etching resulting in vertical shaped sidewalls. This method is quite expensive and time consuming. In addition the application of a metal stack is much more difficult because of the bad step coverage on the vertical sidewalls. A second process is anisotropic lattice determined Si-etching (KOH etching of <100> Si is used). This is a low cost process with well-defined sidewalls. These sidewalls can be easily covered with a metal stack by means of PVD deposition techniques. To minimize the occupied backside area a wafer thinning process is essential. The third suggested process is isotropic Si-etching. Such process is low cost as well but has as disadvantage a larger occupation of the backside and very uncontrolled via dimensions.

In terms of process integration the dry etching method would be preferred. This is because the wet etching processes require a to be developed front side protection. However the step coverage issue and the higher cost of the dry etching method have led to the decision to use the anisotropic etch method. This process results in crude through wafer vias with well defined via dimensions (e.g. 80×80 um).

The type of backside metallization is mainly determined by three aspects: a) the required compatibility with the assembly process (e.g. adhesive bonding), b) the need for a low resistive interconnect, c) limited metal thickness because of sawing restrictions. The latter implies the use of high conductivity metals. Therefore a metal stack consisting of mainly copper (Cu) or silver (Ag) is proposed.

FIG. 9 graphically presents the developed through wafer interconnect process, hereinafter also referred to as TWI process. The three main process modules are wafer thinning (FIG. 9A), via forming (FIG. 9 B through E) and backside metallization (FIG. 9 F). These three process modules and their related process steps such as, e.g. front side protection and additional wet etching steps are described in detail hereinafter.

The TWI process starts with wafers that contain the integrated passive elements on the front side. First to reduce the occupied area at the backside and to ease the via forming process, the wafers need to be thinned to a thickness in the range of 100-300 microns, preferably less than 250 microns and suitably 200 microns. Processing wafer with a thickness of 200 microns in an industrial environment causes handling problems. Any stress in the wafer results in severe bow, thinner wafers give more wafer breakage and automatic wafer handling gets complicated. To overcome these problems wafers with an optimized edge shape have been used.

The wafer thinning process consists of two steps. The first step is mechanical grinding to 220 microns. The second step is the removal of the damaged surface layer created during mechanical (coarse) grinding. This step is also crucial for stress release. The process can be a CMP technique (Chemical Mechanical Polishing), plasma etching or wet etching. Wet etching was used in this case. To remove all the lattice damage and to obtain a defect-free silicon surface it is necessary to etch off 20 microns of silicon. At this stage the defect-free silicon will allow well-controlled KOH etching to form the vias (see FIG. 5).

In order to manufacture the crude through wafer vias, anisotropic Si-etching with potassium hydroxide (KOH) is used. The choice for KOH etching has consequences for the compatibility between front-side and backside processing. First a hard mask of silicon nitride is deposited on the backside side of the wafer. Next the front side of the wafer is protected using a thick organic coating. This coating protects the front side PICS-technology during the subsequent silicon nitride backside patterning. After applying this front side protection, the silicon nitride on the backside (FIG. 9 B) is coated with a photosensitive layer and patterned with standard photolithography techniques (FIG. 9 B). Special attention is paid to alignment of the backside via pattern to the front side electrodes. After the photolithography, the silicon nitride is etched in a BOE solution and next the photoresist and the front side protective coating are removed by a wet chemical process (FIG. 9 C). At this stage the wafer is ready for via etching.

The via etching is done in KOH and this requires the front side of the wafer to be protected. Therefore again a thick organic coating is used (FIG. 9 D). KOH etching gave very controllable and repeatable Si-etching results, giving the via a shape that is determined by the [111] lattice plane with smooth sidewalls with an angle of 55°.

Figure 11:
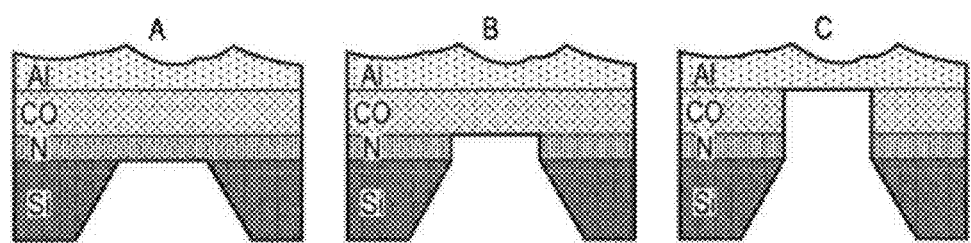
FIG. 11 shows a picture of A) KOH etching stop, B) ortho-phosphoric etching stop, C) CO etching stop.

Subsequently a K+ decontamination procedure is done to prevent cross-contamination in other process steps. The KOH via etching stops at the front side dielectric layer (see FIG. 11 A.). Subsequent wet etching with ortho-phosphoric acid removes both the silicon nitride of the via etch mask and the silicon nitride at the bottom of the via hole from the front side technology (FIG. 11 B).

Figure 12:
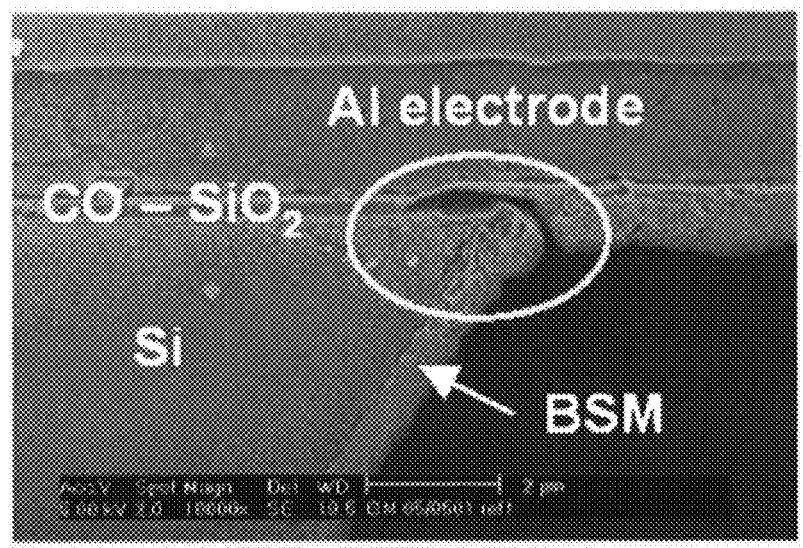
FIG. 12 shows an example of underetching during wet CO etching causing bad step coverage of the backside metallization.
Figure 13:
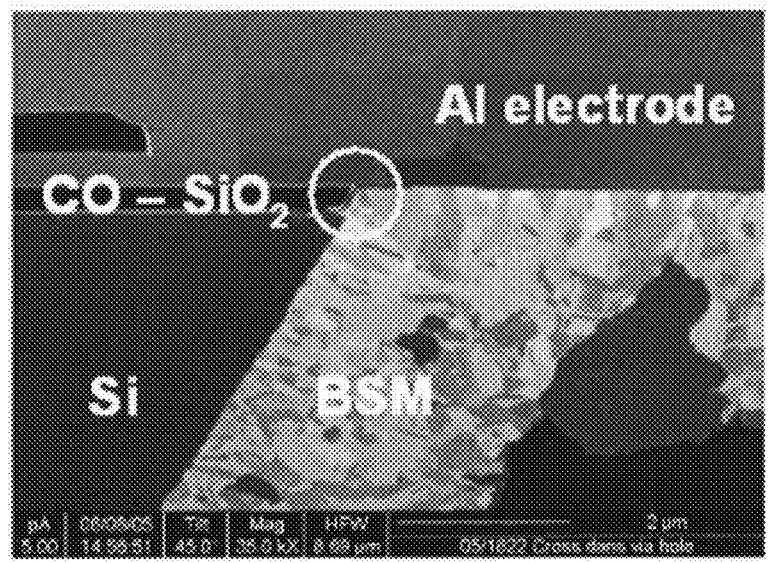
FIG. 13 discloses an example of good step coverage using dry CO etching.

The last etch step in order to reach the front side aluminum electrode is called CO etching. The CO etching can be done by wet etching with BOE or by using a dry etching process. The first method causes under etching of the silicon oxide resulting in bad step coverage of the backside via metallization (see FIG. 12). In case of wet CO etching the protection layer is still needed to protect the front side and is removed afterwards by a wet chemical process (see FIG. 9 E).

The use of a dry etching process (see FIG. 8) facilitates the process flow as the CO layer is etched at once and no front side protection is required. In case of dry $SiO_2$ etching the protection layer is removed by a wet chemical process before starting dry etching.

Dry etching is done with Reactive Ion Etching (RIE) and following the via etching an oxygen plasma is used to remove any organic contamination left. The dielectric layer etch rate at the bottom of the via is reduced by the presence of the silicon sidewalls and this required some additional process setting investigation. To verify the complete removal of the silicon oxide at the via bottom with the chosen process settings a bubbling test was used.

This test consist of applying a drop of diluted KOH in an etched via and inspection by optical microscopy. In case of $SiO_2$ residues no reaction is observed. In case the $SiO_2$ was etched completely the KOH solution will react with the aluminum electrode causing small bubbles.

Figure 14:
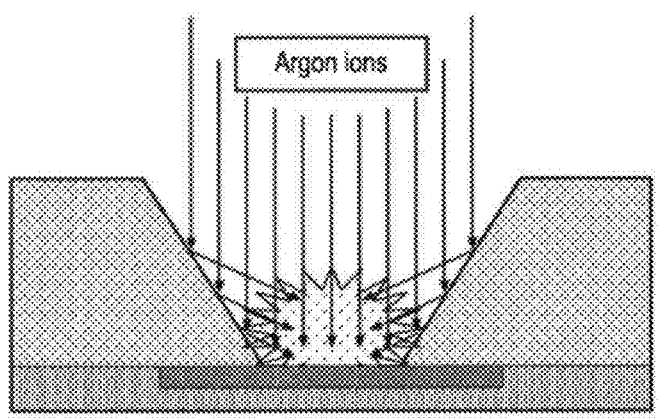
FIG. 14 shows a schematic view of sputter etch in case of sidewalls.

The final challenging process module is the conversion of the vias into conductive vias by depositing a suitable backside metal layer (FIG. 9 F). To realize the stringent electrical specifications (see the introduction) and to have a good adhesion several metal stacks such as TiCulCu, TiNiAg and NiAg were evaluated. All metal layers are applied by DC-magnetron sputtering. For the TiCulCu stack additional Cu electroplating was used in order to obtain a low resistance. Application of a sputter etch (SE) was found to be necessary for the removal of native aluminum oxide (Al2O3). The effectiveness of the sputter etch is hampered by the presence of the via sidewalls (see FIG. 14) and this required process optimization.

Different sputter etch processes were tested and the resulting contact resistance after metallization was measured. The trials revealed that a sputter etch process comparable to etching 30 nm equivalent thermal silicon oxide is necessary to remove the native aluminum oxide. However, substrates exposed to these sputter etch settings did show very bad adhesion of the backside metal to the silicon surface. So low contact resistance to the aluminum electrode requiring a firm sputter etch (sufficient depth) is in conflict with the metal adhesion. This is because the firm sputter etch deteriorates the adhesion of the TiCu/Cu and TiNiAg coatings to the backside silicon surface. It was found that the metal adhesion and via resistance are a direct function of the sputter etch conditions. Table 1 summarizes the measured characteristics of the metal stacks.

TABLE 1

Measured adhesion and via resistance as a function of the metal

| Metal stacks | Adhesion | Via resistance |
|---|---|---|
| Results with sputter etch | | |
| Ti/Cu/Cu | BAD | VERY LOW |
| Ti/Ni/Ag | BAD | LOW |
| Ni/Ag | GOOD | LOW |
| Results without sputter etch | | |
| Ti/Cu/Cu | GOOD | HIGH |
| Ti/Ni/Ag | GOOD | HIGH |

The resistance of the Ti/Cu/Cu stack was 5 mO, the resistance of the Ti/Ni/Ag stack was 13-20 mO and the resistance of the Ni/Ag stack was 9-12 mO. The resistance of the stacks without sputter etch were in the order of 2-3 Ohms. The Ti layer in the stack had a thickness of 100 nm, the Ni layer in the stacks had a thickness of 300 nm. The copper intermediate layer had a thickness of 500 nm. The upper copper layer was formed by electroplating and had a thickness of 3000 nm, while the silver layer had a thickness of 1500 nm. Adhesion was tested with a scratch-tape test and with sawing-tape test. The latter was used because this test mimics the final process step of separating the devices. Furthermore, testing by sawing gave better reproducible results and is a more severe test. The definition of good adhesion is specified as "no delaminating metal", even not in the vicinity of the sawing lane. To evaluate the effect of different process settings following subcategories were made: 1) no delaminating, 2) less than 10% delaminated 3) more than 10% delaminated 4) all metal delaminated. This classification helped to distinguish between different levels in adhesion and to develop the optimal process.

To exclude the effect on adhesion of possible contamination substrates were analyzed at different stages of the process by Time-of-Flight Secondary Ion Mass Spectrometry (TOF-SIMS) surface analysis. These analyzes showed that after CO dry etching a carbon-rich residual layer is present on the silicon surface. The subsequent oxygen plasma step is effectively removes these residues. In addition a wet cleaning step is performed just before applying a sputter etch and metal deposition. Transmission Electron Microscopy (TEM) investigations were done to find the root cause of bad adhesion of the Ti-based metal stacks in case of a sputter etch. This revealed that by sputter etching a very thin amorphous silicon layer was formed. The hypothesis is that this amorphous silicon layer, which has a much higher reactivity towards the titanium adhesion layer, could cause Kirkendall voiding and deteriorates the adhesion.

Crosschecking with a low-reactive nickel metal layer instead of the reactive titanium onto a sputter etched surface, resulting in good adhesion, support the hypothesis. TEM was performed to try to visualize possible Kirkendall voids. The TEM pictures were not conclusive on voids but did reveal that the amorphous silicon layer thickness is in the order of 1 nm. This means that any voids will be very small (nano-voids). TEM images from the Si—Ti and Si—TiNi interface however show some differences in contrast and brightness at the interface. In case of Si—TiNi oxygen is found at the Si—Ti interface, which is not present after titanium deposition only. This oxygen may be diffused into the TEM sample from the side after sample preparation. This would indicate the presence of nano voids. Although this result is only indirect evidence of the presence of voids, we think it is the only plausible explanation for the observations.

Based on these findings the metal stack of only nickel and silver (NiAg) was applied and evaluated on functional devices (see table 1). With this metal stack a low ohmic through wafer interconnect was made and the metal layer showed excellent adhesion towards the silicon surface, even after sawing. This metallization process (NiAg with sputter etch) was selected for further electrical evaluation on product wafers and for reliability testing.

Figure 15:
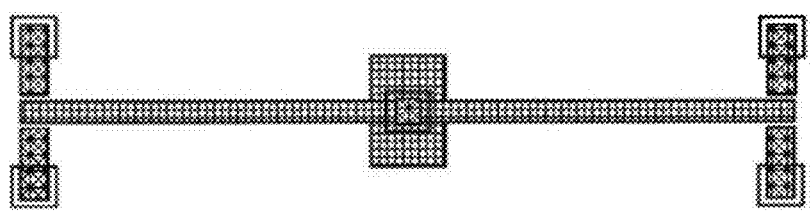
FIG. 15 shows a dedicated test structure for DC and RF characterization on wafer level.

The application of the developed through wafer interconnect technology for RF modules is mainly driven by electrical performance (DC and RF) and reliability. However, measuring RF performance is difficult on standard waferfab equipment (e.g. PCM measurement). Therefore a special test structure was designed allowing DC and RF characterization on wafer level, which is shown in FIG. 15. This structure is used to analyze the relation between the DC and RF resistance. It is made of a strip transmission line shorted to ground in the middle of the structure by a through wafer via. Both ends of the line are connected to Ground Signal Ground (GSG) pads, whose ground connection to the wafer backside is also realized with through wafer vias. The DC resistance is measured by standard four point probing. For a given DC current the structure allows sensing the voltage on the top and bottom of the via and hence the resistance of the via can be determined.

Figure 16:
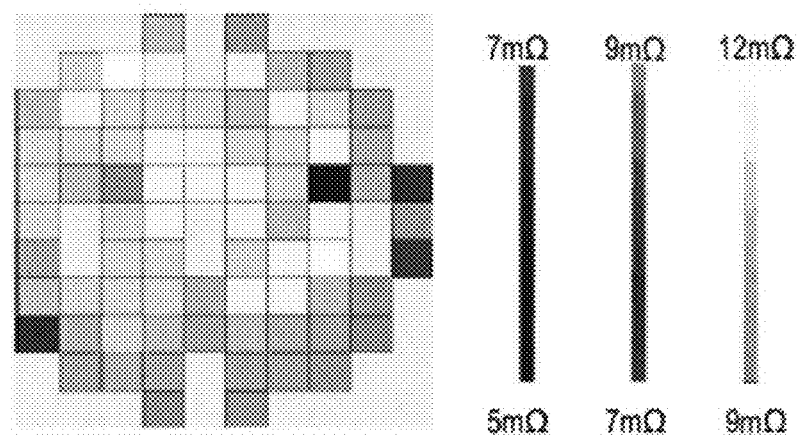
FIG. 16 shows a distribution of the DC resistance of vias on a 6" wafer.

An example of a wafer map for the DC via resistance on a 6" size wafer is shown in FIG. 16. The distribution of the via resistance is very homogenous and varies between 9 and 12 mQ. Some structures near the edge are showing an even lower resistance. For the RF characterization of this test structure, the parasitic effect of the through wafer via in the middle of the strip line can easily be estimated by S-parameter measurements and comparison to ideal shorted lines models. From the S-parameters the via RF resistance and via equivalent series inductance are extracted.

Figure 17:
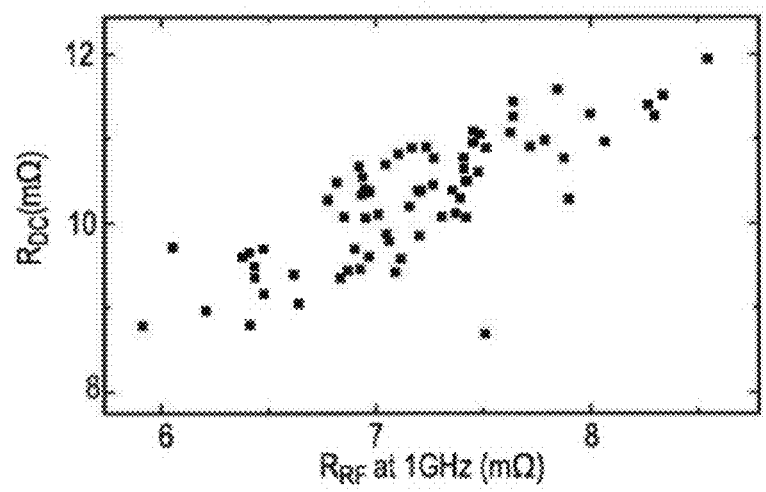
FIG. 17 demonstrates a correlation between the calculated RF-resistance and the measured DC resistance.

A comparison between the DC resistance and RF resistance is shown in FIG. 17. Although the via resistances obtained from RF measurements—performed at 1 GHz—appear to be slightly lower than the DC-measured via resistance, a good correlation is found. This allows using the simple and fast DC measurements for process control.

Figure 18:
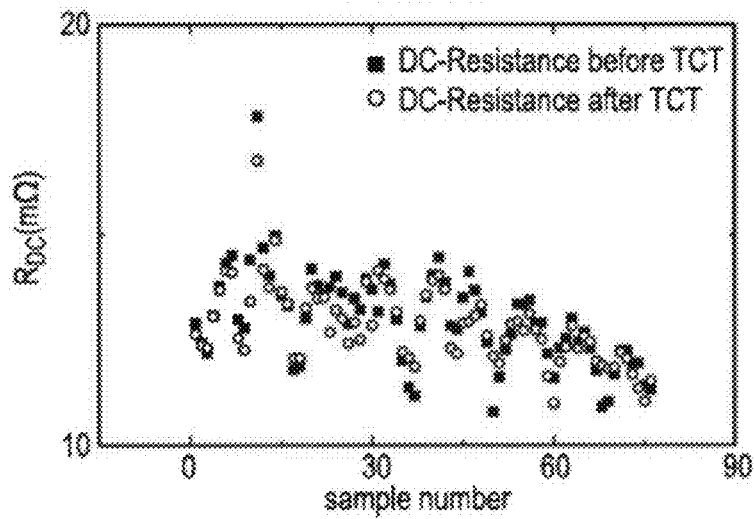
FIG. 18 shows a graphical comparison of the DC resistance of a single via before and after temperature cycling tests.

To check the feasibility of the nickel metallization deposited directly onto silicon and on the aluminum electrode in the via, samples were subjected to a hot storage test (24 hours at 180° C.). No significant change in via resistance was measured. For a first evaluation on the reliability of the front side to backside via interconnection some wafers have been submitted to a temperature cycle test. DC via resistance measurements were used as degradation criterion. The wafers have been exposed to 250 cycles of −65° C. to +150° C. As shown in FIG. 18, the DC-resistance after the temperature cycling test is decreased by approximately 0.5 mQ.

In short, a silicon-based system in package module technology has been developed, including with crude through wafer vias for increasing RF performance. The through wafer vias (TWI) allow double-sided grounding by applying backside metallization. The TWI-process consists of three main process modules: 1) wafer thinning, 2) via forming and 3) backside metallization. The most critical process module is the backside metallization, because of stringent requirements on low resistance and solid adhesion of the metal stack. A metal stack of NiAg, deposited by sputtering including an extensive sputter etch, fulfills the requirements on electrical performance, adhesion and sawing. For the developed TWI process a minimum resistance of 6.5 mOhm and an inductance of 17 pH was found.

For electrical evaluation a special test structure was designed to analyze the relation between DC resistance and RF resistance. A good correlation between the two is found. Furthermore, first evaluations on the reliability of functional PICS devices have shown a stable via resistance.

The invention claimed is:

1. A method of manufacturing an integrated circuit comprising a substrate of semiconductor material with a first and an opposite second side, comprising the steps of:
   providing a metallization layer on the first side of the substrate;
   forming a through-hole extending from the first to the second side of the substrate, and providing a sidewall of the through-hole with an electrically conductive layer to form an interconnect coupled to the metallization layer on the first side of the substrate, wherein prior to provision of the electrically conductive layer an amorphous silicon layer is formed, via etching, in the through-hole, and the electrically conductive layer is of a composition that lessens the damage to the amorphous silicon layer.

2. A method as claimed in claim 1, wherein the amorphous silicon layer is formed at an edge of the through-hole, which edge is adjacent to the first side of the substrate, and wherein the amorphous silicon layer is formed via dry etching.

3. A method as claimed in claim 1, wherein the provision of the electrically conductive layer comprises deposition of a nickel layer directly on top of the amorphous silicon layer.

4. A method as claimed in claim 3, wherein the provision of the electrically conductive layer further comprises deposition of a silver layer.

5. A method as claimed in claim 1, wherein the substrate is provided with a plurality of vias and the electrically conductive layer extends on the second side of the substrate so as to interconnect the interconnects in individual through-holes.

6. A method as claimed in claim 1, wherein the metallization layer is provided on an electrically insulating layer.

7. The method of claim 1, wherein the electrically conductive layer is of a composition that lessens damage to the amorphous silicon layer due to the amorphous silicon layer reacting with an adhesion layer between the electrically conductive layer and the substrate.

8. The method of claim 1, wherein the electrically conductive layer has a resistance of approximately 9-12 mO.

9. The method of claim 1, wherein the electrically conductive layer has a resistance lower than a Ti/Cu/Cu stack.

10. A method of manufacturing an integrated circuit comprising a substrate of semiconductor material with a first and an opposite second side, comprising the steps of:
provides a metallization layer on the first side of the substrate;
forming a through-hole extending from the first to the second side of the substrate, and providing a sidewall of the through-hole with an electrically conductive layer to form an interconnect coupled to the metallization layer on the first side of the substrate, wherein prior to provision of the electrically conductive layer an amorphous silicon layer is formed in the through-hole,
wherein the amorphous silicon layer is formed by sputter etching, and
the electrically conductive layer is of a composition that the amorphous silicon layer is not damaged.

11. A method as claimed in claim 10, wherein the metallization layer comprises aluminum or an aluminum alloy.

12. An integrated circuit comprising a substrate of semiconductor material with a first and an opposite second side, on which first side a metallization layer is present, while a through-hole with a side wall extends from the first to the second side of the substrate, on which side wall an electrically conductive layer is present to form an interconnect, which interconnect is coupled to the metallization layer on the first side of the substrate, wherein an etched amorphous silicon layer is present-in the through-hole, and the electrically conductive layer is of a composition that lessens damage to the amorphous silicon layer.

13. An assembly comprising the integrated circuit as claimed in claim 12 and a further integrated circuit attached thereto.

14. The integrated circuit of claim 12, wherein the electrically conductive layer is of a composition that lessens damage to the amorphous silicon layer due to the amorphous silicon layer reacting with an adhesion layer between the electrically conductive layer and the substrate.

* * * * *